United States Patent [19]
Warren, Jr. et al.

[11] Patent Number: 5,737,846
[45] Date of Patent: Apr. 14, 1998

[54] LEAD FRAME DRYER

[75] Inventors: Waite R. Warren, Jr., Raleigh; Lou W. Nicholls, Durham, both of N.C.

[73] Assignee: Mitsubishi Semiconductor America, Inc., Durham, N.C.

[21] Appl. No.: 755,049

[22] Filed: Nov. 22, 1996

[51] Int. Cl.[6] .................................................. F26B 19/00
[52] U.S. Cl. .................. 34/71; 34/85; 34/95; 15/256.52; 15/308
[58] Field of Search .................... 34/60, 61, 69, 34/70, 71, 85, 90, 92, 95, 611, 618, 620, 240; 100/90, 121, 160; 15/302, 308, 256.51, 256.52

[56] References Cited

U.S. PATENT DOCUMENTS

| | | | |
|---|---|---|---|
| 2,209,759 | 7/1940 | Berry | 34/336 |
| 2,234,153 | 3/1941 | Herbert | 34/70 |
| 2,240,315 | 4/1941 | Rhodes et al. | 34/70 X |
| 2,303,123 | 11/1942 | Johannessen | 34/335 |
| 3,405,453 | 10/1968 | Ries | 34/336 |
| 3,683,447 | 8/1972 | Stevenson | 15/352 |
| 3,737,729 | 6/1973 | Carney | 317/101 PH |
| 3,915,780 | 10/1975 | Broussard, Jr. et al. | 156/244 |
| 4,133,861 | 1/1979 | Kato | 264/216 |
| 4,216,051 | 8/1980 | Brown et al. | 156/499 |
| 4,395,113 | 7/1983 | Buchan et al. | 15/256.53 X |
| 4,960,140 | 10/1990 | Ishijima et al. | 134/31 |
| 5,422,314 | 6/1995 | Sekiba | 437/220 |
| 5,530,537 | 6/1996 | Thayer | 15/256.52 X |

*Primary Examiner*—Henry A. Bennett
*Assistant Examiner*—Steve Gravini
*Attorney, Agent, or Firm*—Lowe, Price, LeBlanc & Becker

[57] ABSTRACT

A lead frame dryer comprises a pair of water absorbing rollers positioned downstream of a lead frame water jet deflasher. The water absorbing rollers remove water from surfaces of the lead frame. A solid roller is positioned adjacent each of the water absorbing rolls to squeegee to compress the water absorbing roller and remove water stored in the water absorbing rollers for collection. A venturi device is provided which creates a vacuum for absorbing water removed from the water absorbing rolls. The collected water can be recycled back to the water jet deflasher.

8 Claims, 1 Drawing Sheet

LEAD FRAME DRYER

TECHNICAL FIELD

The present invention is directed to a lead frame dryer and, in particular, to a dryer which allows for lead frame stacking and subsequent separation and easy recycle of water collected from the head frames during drying.

BACKGROUND ART

In the prior art, the use of water jet deflashers is known in treating lead frames. The deflashers are used to remove any residual epoxy films on the lead frame that may be created during epoxy encapsulation of components on the lead frame. Often times, when the lead frame is positioned between dies for epoxy encapsulation, the epoxy may escape out through the die making surfaces, thereby leaving a sliver or thin film of epoxy on the lead frame. Deflashers remove this extraveneous epoxy by two stage operations such as a cathodic deflashing treatment followed by a high pressure water jet removal step.

Typically, these deflashers include sponge rollers in the deflasher housing which absorb water on the surfaces of the lead frame so that the lead frames exit the deflasher in a dry state. The lead frames are then subsequently stacked in a magazine downstream of the deflasher and moved again individually using vacuum apparatus.

One of the drawbacks of these prior art systems is that the lead frames are not completely dry when exiting the deflasher. Consequently, the lead frames can stick together when stacked and then cannot be individually separated for further processing. The sponge rollers located in the deflasher housing tend to permit water to fall back onto the lead frames so that they are not completely dry when exiting the deflasher.

As such, a need has developed to provide an improved lead frame dryer which completely dries the lead frames for stacking and subsequent individual use.

In response to this need, the present invention provides a lead frame dryer which effectively removes water from a lead frame when exiting a water jet deflasher. The inventive lead frame dryer can also recycle the collected water back to the water jet deflasher so that no separate exhaust or collection system is needed.

DISCLOSURE OF THE INVENTION

Accordingly, it is a first object of the present invention to provide an improved lead frame dryer.

Another object of the present invention is to provide a lead frame dryer which does not require a collection or exhaust system.

A further object of the present invention is to provide a method of drying lead frames for stacking and subsequent individual lead frame use.

Other objects and advantages of the present invention will become apparent as a description thereof proceeds.

In satisfaction of the foregoing objects and advantages, the present invention provides a lead frame dryer downstream of a water jet deflasher wherein the lead frames exit the deflasher apparatus and are stacked together. The lead frame dryer comprises a pair of water absorbing rollers positioned downstream from an exit of the water jet deflasher and spaced apart from each other to receive a traveling lead frame therebetween. The water absorbing rollers remove water from the lead frame surfaces.

A pair of solid rollers are also provided, one solid roller positioned adjacent each of the water absorbing rollers. Each said roller rotates in a direction opposite to a rotation of a respective water absorbing roller. These solid rollers are positioned to compress the water absorbing rollers and remove water therefrom.

The lead frame dryer also includes a venturi device which produces a vacuum. The venturi device includes a conduit positioned adjacent each solid roller to collect the water removed from the water absorbing rollers.

The venturi device can also include a recycle line wherein the water collected by the venturi device is directed back to the water jet deflasher.

Preferably, the water absorbing rollers are made from a sponge material. The water absorbing rollers and/or the solid rollers can be driven or can be freely rotating by action of the lead frame traveling between the water absorbing rollers.

Preferably, the venturi device uses an air source and a pipeline interconnecting the air source with the pipeline exit. The conduit disposed adjacent the solid rollers is in communication with the pipeline. With this arrangement, a vacuum is created by the air source passing over the site where the conduit opens into the pipeline to produce the necessary vacuum to collect the water removed by compression of the water absorbing roller. The pipeline exit can be disposed in the water jet deflasher for recycle of the collected water. Consequently, a separate exhaust or collecting system is not needed in connection with the venturi device.

In the method aspect of the invention, a lead frame exiting a water jet deflasher is dried by first absorbing and storing the water present on the lead frame after it exits the water jet deflasher. The stored water is then removed and collected. The sequence of absorbing, storing, removing and collecting is repeated for each lead frame exiting the water jet deflasher.

The collected water can be recycled back to the deflasher apparatus if so desired.

BRIEF DESCRIPTION OF DRAWINGS

Reference is now made to the sole FIGURE of the patent application wherein a schematic illustration of the inventive apparatus is illustrated.

BEST MODE FOR CARRYING OUT THE INVENTION

Figure 1:
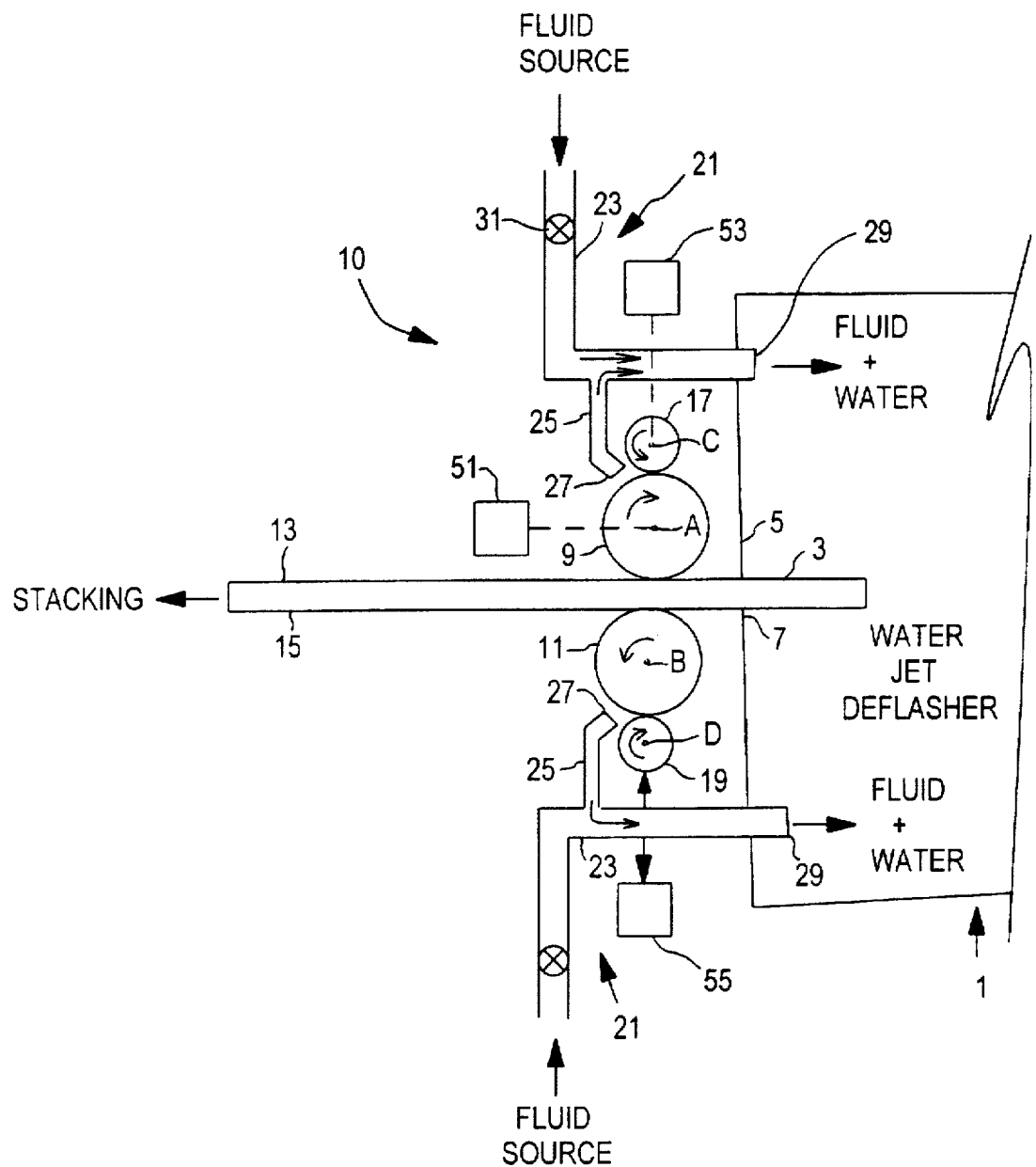

With reference now to the sole FIGURE, the inventive lead frame dryer is generally designated by the reference numeral 10 and is shown positioned downstream from a water jet deflasher 1. Since these water jet deflashers are well known apparatus in the field of processing lead frames for semiconductors or other electric component manufacture, a further description thereof is not deemed necessary for understanding of the invention.

As explained above, the lead frame is processed in the water jet deflasher and exits the deflasher housing at exit port 7. The lead frame then is subsequently stacked.

In order to completely dry the lead frame prior to stacking, the inventive lead frame dryer 10 positions a pair of water absorbing rollers 9 and 11 for rotation about their respective axes A and B downstream of the exit port 7. The water absorbing rollers 9 and 11 can be freely rotatable about the axis A and B by movement of the lead frame therebetween. Alternatively, the water absorbing rollers 9 and 11 can be driven by any conventional drive on their respective axes A and B.

The water absorbing rollers 9 and 11 are preferably sponge covered solid rollers and are designed to absorb the water on the lead frame surfaces 13 and 15. The water on the surfaces 13 and 15 is removed and stored in the water absorbing rollers 9 and 11 during the travel of the rollers 9 and 11 from a point of absorption on the lead frame surfaces to a point of compression wherein solid rollers 17 and 19 compress the water absorbing rollers 9 and 11, respectively. The solid rollers 17 and 19 also rotate on their respective axes C and D, either freely by reason of their contact with the rotating rollers 9 and 11 or by a separate drive.

Since the water absorbing rollers 9 and 11 are compressible, the solid rollers 17 and 19 perform a squeegee or compressing action to remove any stored water in the rollers 9 and 11. The water removed from the water absorbing rollers 9 and 11 is collected by a vacuum created by a venturi device 21. The venturi device 21 includes a fluid source such as compressed air, steam, inert gas or the like. The fluid source provides the fluid to a pipeline 23. A conduit 25 is in communication with the pipeline 23, the conduit having a nozzle 27 positioned adjacent the area of contact between the solid rollers 17 and 19 and the water absorbing rollers 9 and 11, respectively. Flow of the fluid through the pipeline 23 creates a vacuum effect in the conduit 25 and nozzle 27 to collect water removed from the water absorbing rollers 9 and 11 by the compressing action of the solid rollers 17 and 19. The flow of collected water and fluid are represented by the two arrows in the vicinity of the junction of the conduits 25 and pipeline 23. The fluid and water mixture can then be recycled back to the water jet deflasher 1. With this recycle feature, there is no need for a separate collection or exhaust system for the venturi device 21. Of course, the fluid and water mixture could be vented to atmosphere or another collection system rather than to the water jet deflasher via the pipeline exit 29.

Since the water absorbed by the water absorbing rollers 9 and 11 is removed by the compressing action of the rollers 17 and 19 against the rollers 9 and 11, the water absorbing rollers 9 and 11 are substantially dry for additional water pickup from the next lead frame to be dried. No water is left on the roller to fall back onto the lead frame surface during the water absorbing rollers' revolutions. Thus, the lead frames are substantially dry so that they can be stacked and then picked up one at a time using vacuum devices or other apparatus.

Although a sponge roller is described as a preferred water absorbing roller, any type of material capable of absorbing water and being compressed to release the water can be used for the rollers 9 and 11. Preferably, the water absorbing rollers have the water absorbing material around a circumference thereof and include a solid core so that a compression surface is provided by the solid core for the compressing action of the solid rollers 17 and 19.

The solid rollers 17 and 19 can also be made of any durable material which is generally not water absorbent so that the water removed from the water absorbing rollers 9 and 11 can be effectively collected by the venturi nozzles 27.

In addition, the compression between the rollers 17 and 19 and water absorbent rollers 9 and 11 can be varied depending on the water absorbing material and the amount of water collected. A drive could be provided which would regulate the spacing between each solid roller and its adjacent water absorbing roller to control the amount of compression of the water absorbing material of the rollers 9 and 11 for water removal therefrom.

Referring again to FIG. 1, various drives (in schematic form) are depicted in conjunction with the rollers. One drive for rotating the water absorbing roller 9 is designated by the reference 51. A similar drive (not shown) could also be provided for the water absorbing roller 11. Likewise, a drive 53 is schematically depicted for rotating the solid roller 17. A similar drive (not shown) could also be used for roller 19. Finally, a drive 55 is schematically shown to adjust the compression of the water absorbing role 11 by roller 19. A similar drive could be used for roller 17. The venturi devices 21 can also include valves 31 to initiate and/or control the venturi effect for water collection.

From an economical standpoint, a compressed air source is preferred for the venturi devices 21 since this medium is the least expensive to create the necessary vacuum for water collection. It should also be understood that other configurations or venturi effect designs could be utilized providing that a vacuum is created at the junction between the water absorbing rollers and their respective solid roller for water collection.

The recycle feature of the venturi unit also solves any environmental problems since no waste effluent is created with the inventive lead frame dryer. The effluent is recycled back to the water jet deflasher and can be treated as part of this unit.

As such, an invention has been disclosed in terms of preferred embodiments thereof which fulfill each and every one of the objects sets forth herein above and provides a new and improved lead frame dryer and a method of drying lead frames.

Of course, various changes, modifications and alterations from the teachings of the present invention may be contemplated by those skilled in the art without departing from the intended spirit and scope thereof. Accordingly, the present invention is only limited by the terms of the appended claims.

We claim:

1. A lead frame dryer for a water jet deflasher apparatus wherein the lead frames exit the deflasher apparatus and are stacked together, the lead frame dryer comprising:

a) a pair of water absorbing rollers positioned downstream from an exit of said water jet deflasher apparatus and spaced apart from each other to receive a lead frame therebetween to absorb water on said lead frame;

b) a pair of solid rollers, one solid roller positioned adjacent each of said water absorbing rollers, each solid roller moving in a direction opposite to a direction of movement of an adjacent water absorbing roller and compressing said water absorbing roller to remove water therefrom; and c) a venturi device for producing a vacuum, the venturi device including a conduit positioned adjacent each solid roller to collect said water removed from said water absorbing roller said solid rollers using said vacuum.

2. The apparatus of claim 1 including a recycle line diverting water collected by said venturi device back to said water jet deflasher apparatus.

3. The apparatus of claim 1 wherein each said water absorbing roller includes a sponge material surrounding a solid core roller.

4. The apparatus of claim 1 wherein each of said water absorbing rolls are rotated by a drive.

5. The apparatus of claim 1 wherein each of said water absorbing rollers rotates by action of said lead frame passing thereagainst.

6. The apparatus of claim 1 wherein each solid roller is rotated by a drive, each solid roller driving an adjacent water absorbing roller.

7. The apparatus of claim 1 wherein said venturi device further comprises:

i) an air source; and ii) a pipeline interconnecting said air source with a pipeline exit, said conduit in communication with pipeline;

iii) whereby flow of air from said air source to said pipeline exit creates said vacuum in said conduit for said collection of said water.

8. The apparatus of claim 7 wherein said pipeline exit is disposed in said water jet deflasher apparatus for recycle of said collected water.

* * * * *